(12) United States Patent  
Ishibashi

(10) Patent No.: US 9,094,629 B2
(45) Date of Patent: Jul. 28, 2015

(54) IMAGE PICKUP APPARATUS

(75) Inventor: Koji Ishibashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 528 days.

(21) Appl. No.: 13/562,152

(22) Filed: Jul. 30, 2012

(65) Prior Publication Data

US 2013/0032695 A1 Feb. 7, 2013

(30) Foreign Application Priority Data

Aug. 5, 2011 (JP) ................... 2011-172179

(51) Int. Cl.
*H04N 5/335* (2011.01)
*H04N 5/378* (2011.01)
*H03M 1/00* (2006.01)
*H03M 1/56* (2006.01)

(52) U.S. Cl.
CPC ............... *H04N 5/378* (2013.01); *H03M 1/004* (2013.01); *H03M 1/56* (2013.01)

(58) Field of Classification Search
CPC ..... H03M 1/004; H03M 1/007; H03M 1/008; H03M 1/12; H03M 1/123; H03M 1/50; H03M 1/56; H04N 5/335; H04N 5/369; H04N 5/378
See application file for complete search history.

(56) References Cited

U.S. PATENT DOCUMENTS

| | | | |
|---|---|---|---|
| 5,892,540 A * | 4/1999 | Kozlowski et al. ........... 348/300 |
| 6,545,624 B2 * | 4/2003 | Lee et al. ....................... 341/155 |
| 6,757,627 B2 * | 6/2004 | Mizuno .......................... 702/65 |
| 7,230,561 B2 * | 6/2007 | Lee ................................ 341/172 |
| 7,265,708 B2 * | 9/2007 | Mitra et al. ................... 341/172 |
| 7,683,814 B2 * | 3/2010 | Maruyama .................... 341/121 |
| 7,777,662 B2 * | 8/2010 | Meynants et al. ............. 341/163 |
| 8,466,995 B2 * | 6/2013 | Suzuki et al. ................. 348/308 |
| 2005/0057675 A1 * | 3/2005 | Lee et al. ....................... 348/308 |
| 2006/0028360 A1 * | 2/2006 | Tittel .............................. 341/50 |
| 2006/0038208 A1 | 2/2006 | Terzioglu et al. |
| 2006/0049972 A1 * | 3/2006 | Augusto et al. ............... 341/155 |
| 2006/0097902 A1 * | 5/2006 | Muramatsu et al. .......... 341/155 |
| 2009/0009641 A1 * | 1/2009 | Asayama et al. ............. 348/294 |
| 2009/0303096 A1 * | 12/2009 | Chmelar ........................ 341/160 |
| 2010/0091167 A1 | 4/2010 | Azami et al. |
| 2010/0194621 A1 * | 8/2010 | Mizoguchi et al. ........... 341/172 |
| 2010/0238057 A1 * | 9/2010 | Wood ............................ 341/124 |

(Continued)

FOREIGN PATENT DOCUMENTS

| | | |
|---|---|---|
| JP | 2007-281540 A | 10/2007 |
| JP | 2008-187565 A | 8/2008 |
| JP | 2010-093641 A | 4/2010 |

*Primary Examiner* — John Lee
(74) *Attorney, Agent, or Firm* — Canon U.S.A., Inc. IP Division

(57) ABSTRACT

An image pickup apparatus includes a pixel generating a signal by photoelectric conversion, a comparator comparing the signal based on the pixel with a reference signal varied with time, a counter performing counting until the comparator outputs a signal indicating that a relationship in magnitude between the signal based on the pixel and the reference signal is reversed, and a control unit. The comparator includes a first amplifier receiving the reference signal at a first input portion and the signal based on the pixel at a second input portion to compare the signal based on the pixel with the reference signal. The control unit sets a bandwidth of the comparator to a first bandwidth when the reference signal varies at a first rate of change and to a second bandwidth when the reference signal varies at a second rate of change.

13 Claims, 8 Drawing Sheets

(56) References Cited

U.S. PATENT DOCUMENTS

| | | |
|---|---|---|
| 2011/0007198 A1* | 1/2011 | Rossi .......................... 348/300 |
| 2011/0013058 A1* | 1/2011 | Sakurai et al. ............... 348/294 |
| 2011/0041091 A1 | 2/2011 | Sato et al. |
| 2011/0062314 A1* | 3/2011 | Doege ..................... 250/214 R |
| 2011/0069191 A1* | 3/2011 | Jung et al. ................. 348/222.1 |
| 2011/0194004 A1* | 8/2011 | Chen et al. ................... 348/300 |
| 2011/0242385 A1* | 10/2011 | Nishihara ..................... 348/308 |
| 2011/0292261 A1* | 12/2011 | Hwang et al. ................. 348/294 |
| 2012/0074956 A1* | 3/2012 | Fife et al. ..................... 324/612 |
| 2012/0154649 A1* | 6/2012 | Itzhak et al. .................. 348/294 |
| 2012/0169909 A1* | 7/2012 | Rysinski et al. .............. 348/302 |
| 2012/0194368 A1* | 8/2012 | Rysinski et al. .............. 341/120 |
| 2013/0021181 A1* | 1/2013 | Shah ............................ 341/110 |
| 2013/0021493 A1* | 1/2013 | Ishibashi .................... 348/222.1 |
| 2013/0032695 A1* | 2/2013 | Ishibashi .................... 250/208.1 |

* cited by examiner

IMAGE PICKUP APPARATUS

BACKGROUND OF THE INVENTION

1. Field of the Invention

The present invention relates to an image pickup apparatus.

2. Description of the Related Art

Image sensors are proposed, in which column parallel analog-to-digital (AD) converters (each including an AD converter for every pixel column) are installed as pixel readout circuits. The column parallel AD converters compare pixel signals with ramp reference signals with comparators and count the times from start of conversion to inversion of the outputs from the comparators to perform AD conversion. The column parallel AD converters each have the low-speed AD converter for every pixel column to perform the AD conversion in parallel. Accordingly, it is possible to reduce the bandwidths of the comparators and amplifiers composing the column parallel AD converters, so that the column parallel AD converters have the advantages over other AD conversion methods in terms of signal-to-noise (S/N) ratio. In order to reduce the noises in the column parallel AD converters, it is necessary to reduce the bandwidths of the comparators and the column amplifiers as much as possible to suppress white noises outside the signal bandwidths. In particular, since the bandwidths of the comparators downstream of analog blocks can be reduced to limit the noise bandwidths of the pixels, the column amplifiers, and the comparators, it is possible to efficiently reduce the noises.

Japanese Laid-Open Patent No. 2010-093641 describes a method of limiting a bandwidth by using a mirror effect of transistors in order to efficiently reduce the bandwidth of a first stage of a comparator including two-stage amplifiers with a smaller capacitance. In this method, the mirror effect is used to decrease the capacitance charged and discharged with the current from the first stage of the comparator, thereby reducing inversion delay of the comparator. However, the amount of inversion delay in the comparator is determined by the bandwidth of the comparator and the time constant required for the charge and discharge of the current. Accordingly, only decreasing the capacitance of the charge and discharge by using the mirror effect achieves limited improvement of the inversion delay. In addition, since the inversion delay in the comparator is varied with the inclination of a ramp reference voltage that is input, it is difficult to impose appropriate bandwidth limitation in a method of fixedly setting a bandwidth limiting capacitance.

Japanese Laid-Open Patent No. 2007-281540 describes a technology to allow alleviation of the effect of supply voltage drop caused by the inversion of a comparator by using a capacitance between an output signal line of the first stage of the comparator and a power supply and reduction in noise by the bandwidth limitation in the first stage of the comparator. However, as in Japanese Laid-Open Patent No. 2010-093641, it is difficult to achieve appropriate noise reduction effect without decreasing the frame rate in the method of fixedly setting a bandwidth limiting capacitance because of the effect of the inversion delay varied with the inclination of the ramp reference voltage.

In the column parallel AD converters, the method of imposing the bandwidth limitation of the comparators is effectively used in order to improve the S/N ratio. However, in the bandwidth limitation using fixed capacitances, when the inclinations of the ramp reference voltages are varied, the inversion delay in the comparators is increased because the bandwidths of the comparators are too narrow to reduce the frame rate or it is not possible to sufficiently reduce the noises because the bandwidths of the comparators are too wide. Accordingly, it is necessary to vary the bandwidths of the comparators in accordance with the variation in inclination of the ramp reference voltages in the image pickup apparatuses using the column parallel AD converters.

SUMMARY OF THE INVENTION

The present invention provides an image pickup apparatus including a pixel configured to generate a signal by photoelectric conversion, a comparator configured to compare the signal based on the pixel with a reference signal varied with time, a counter configured to perform counting until the comparator outputs a signal indicating that a relationship in magnitude between the signal based on the pixel and the reference signal is reversed, and a control unit. The comparator includes a first amplifier that receives the reference signal at a first input portion and the signal based on the pixel at a second input portion to compare the signal based on the pixel with the reference signal. The control unit sets a bandwidth of the comparator to a first bandwidth when the reference signal varies with time at a first rate of change and sets the bandwidth of the comparator to a second bandwidth broader than the first bandwidth when the reference signal varies with time at a second rate of change smaller than the first rate of change.

Further features of the present invention will become apparent from the following description of exemplary embodiments with reference to the attached drawings.

DESCRIPTION OF THE EMBODIMENTS

Figure 1:
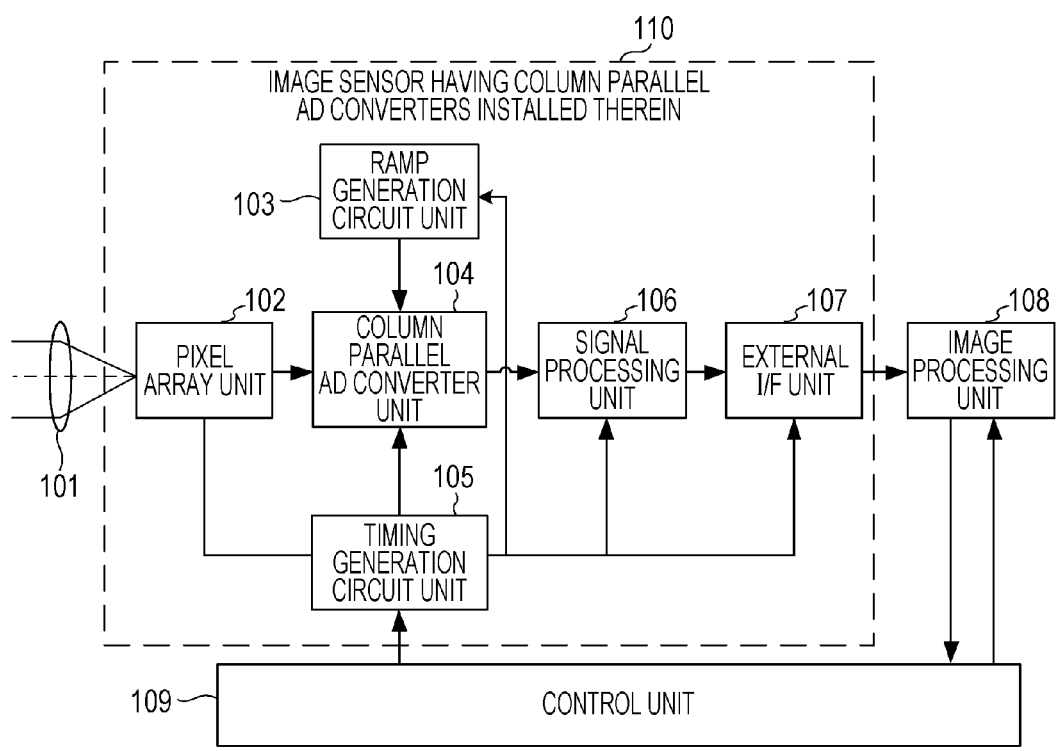
FIG. 1 is a block diagram showing an example of the configuration of an image pickup apparatus according to an embodiment of the present invention.

FIG. 1 is a block diagram showing an example of the configuration of an image pickup apparatus according to an embodiment of the present invention. Referring to FIG. 1, the image pickup apparatus is, for example, a camera system and includes an optical unit that leads incident light into a pixel area of an image sensor 110 having column parallel AD converters installed therein (that forms an image of an object), for example, a lens 101 that forms an image of incident light (image light) on an imaging plane. The image pickup apparatus includes the image sensor 110 having column parallel AD converters installed therein, an image processing unit 108 that performs certain signal processing to a pixel signal supplied from the image sensor 110, and a control unit 109 that controls driving of the image processing unit 108. The control unit 109 includes a timing generator that generates various timing signals including a start pulse and a clock pulse used to drive the circuits in the image sensor 110, and drives the image sensor 110 at certain timing. The image processing unit 108 converts RGB signals output from pixels into an YCbCr color space and performs certain image processing, such as gamma correction. The image signals processed in the image processing unit 108 are recorded on a recording medium, such as a memory. The image information stored in the recording medium is hard-copied by a printer or the like. The image signals processed in the image processing unit 108 are displayed on a monitor, such as a liquid crystal display, as a movie. The image sensor 110 includes a pixel array unit 102 that converts the light the image of which is formed by the lens 101 into an electrical signal and a ramp generation circuit unit 103 that generates a ramp reference signal used as a reference signal in AD conversion. The ramp reference signal is the reference signal that is varied with time. The image sensor 110 also includes a column parallel AD converter unit 104 that converts the analog signal supplied from the pixel array unit 102 into a digital signal and a timing generation circuit unit 105 that generates a control pulse in the AD conversion. The image sensor 110 further includes a signal processing unit 106 that performs processing including correlated double sampling (CDS) to the output result of the AD conversion and an external interface (I/F) unit 107, such as Low-Voltage Differential Signaling (LVDS). Only the feature components in the present embodiment are described although the image pickup apparatus has various other functional components.

Figure 2:
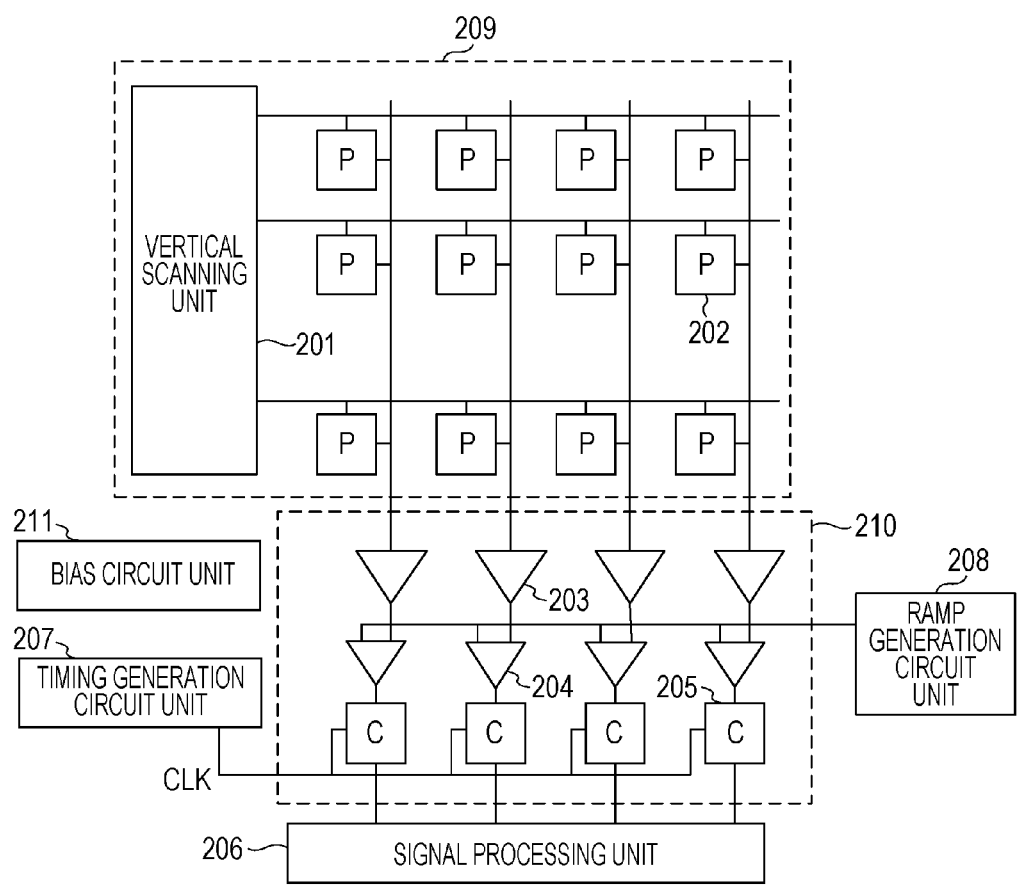
FIG. 2 is a block diagram showing an example of the configuration of an image sensor having column parallel AD converters installed therein.

FIG. 2 is a block diagram showing an example of the configuration of the image sensor (Complementary Metal Oxide Semiconductor (CMOS) image sensor) 110 having column parallel AD converters installed therein in FIG. 1. A pixel array unit 209 in FIG. 2 corresponds to the pixel array unit 102 in FIG. 1. A column parallel AD converter unit 210 in FIG. 2 corresponds to the column parallel AD converter unit 104 in FIG. 1. A ramp generation circuit unit (a reference signal generating circuit) 208 in FIG. 2 corresponds to the ramp generation circuit unit 103 in FIG. 1. A timing generation circuit unit 207 in FIG. 2 corresponds to the timing generation circuit unit 105 in FIG. 1. A signal processing unit 206 in FIG. 2 corresponds to the signal processing unit 106 in FIG. 1. The image sensor 110 having column parallel AD converters installed therein includes the pixel array unit 209 serving as an image capturing unit, the signal processing unit 206, and the timing generation circuit unit 207 that controls the timing of various drive pulses. The pixel array unit 209 includes pixels 202 arrayed in a two-dimensional matrix pattern and a vertical scanning unit 201. The image sensor 110 also includes the column parallel AD converter unit 210 serving as a readout unit for the pixel array unit 209 and a bias circuit unit 211 that controls current flowing through column amplifiers 203, comparators 204, and so on. The image sensor 110 further includes the ramp generation circuit unit 208 that generates the ramp reference signal. The column parallel AD converter unit 210 includes the column amplifiers 203, the comparators 204, and counters 205. The counters 205 each count the clock count of a clock signal CLK generated by the timing generation circuit unit 207. Among the above components, the pixel array unit 209, the vertical scanning unit 201, the column parallel AD converter unit 210, the ramp generation circuit unit 208, and the bias circuit unit 211 are analog circuits, and the timing generation circuit unit 207 and the signal processing unit 206 are digital circuits. Each pixel 202 includes a photodiode and an in-pixel amplifier and generates a signal by photoelectric conversion. For example, the pixels 202 each having the configuration shown in FIG. 7 are arranged in a matrix pattern.

Figure 7:
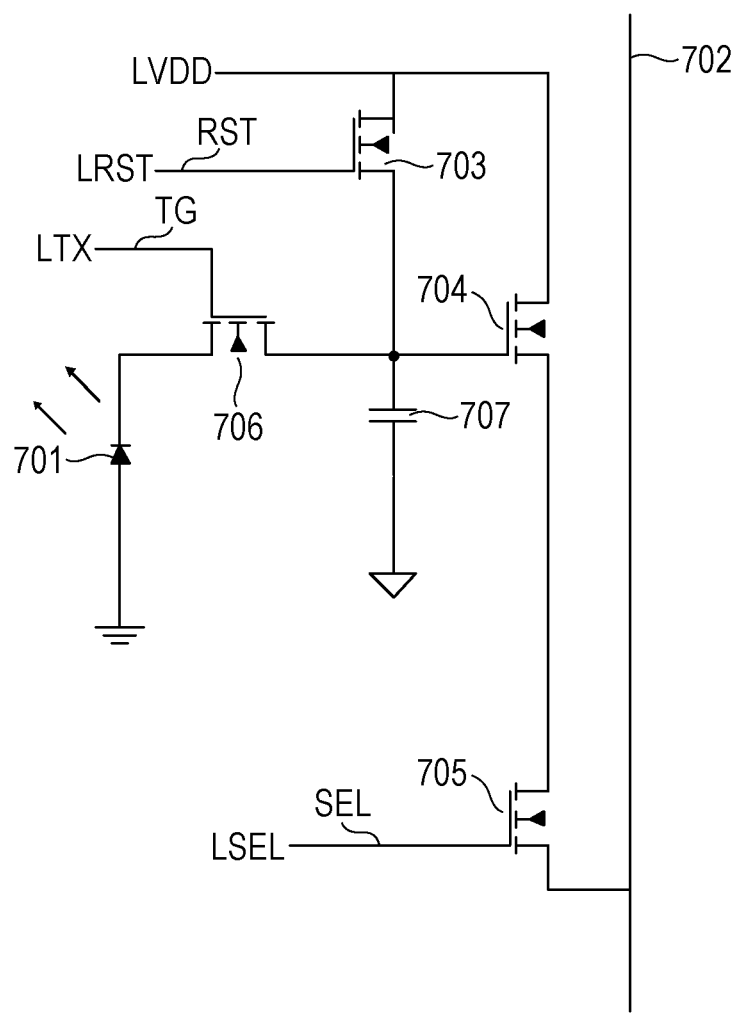
FIG. 7 shows an example of the configuration of each pixel in the image sensor having column parallel AD converters installed therein.

FIG. 7 shows an example of the configuration of each pixel 202 in the image sensor 110. Referring to FIG. 7, the pixel 202 includes a photoelectric conversion element (for example, a photodiode) 701, a transfer transistor 706 serving as a transfer switch, a reset transistor 703 that resets the pixel level, an amplifier transistor 704, and a selection transistor 705. The photodiode 701 photoelectrically converts the incident light into electric charge (electron) of an amount corresponding to the light intensity of the incident light. The transfer transistor 706 is connected between the photodiode 701 and a floating diffusion (FD) 707 serving as an output node of the photodiode 701. The transfer transistor 706 receives a drive signal TG at its gate (transfer gate) via a transfer control line LTX to transfer the electric charge subjected to the photoelectric conversion in the photodiode 701 to the floating diffusion 707. The reset transistor 703 is connected between a power line LVDD and the floating diffusion 707. The reset transistor 703 receives a reset signal RST at its gate via a reset control line LRST to reset the potential of the floating diffusion 707 to the potential of the power line LVDD. The floating diffusion 707 is connected to a vertical signal line 702 via the amplifier transistor 704. The amplifier transistor 704 composes a source follower with a constant current source outside the pixel 202.

A control signal (an address signal or a selection signal) SEL is supplied to the gate of the selection transistor 705 via a selection control line LSEL to turn on the selection transistor 705. In response to turning on of the selection transistor 705, the amplifier transistor 704 amplifies the potential of the floating diffusion 707 and supplies a voltage depending on the potential of the floating diffusion 707 to the vertical signal line 702. The voltage output from each pixel 202 through the vertical signal line 702 is supplied to the column parallel AD converter unit 210 serving as a pixel signal readout circuit. The above operations are concurrently performed for the pixels 202 in one row because, for example, the gates of the transfer transistor 706, the reset transistor 703, and the selection transistor 705 are connected for every row.

A set of the reset control line LRST, the transfer control line LTX, and the selection control line LSEL wired in the pixel array unit 209 is wired for every row of the array of the pixels 202. The reset control line LRST, the transfer control line LTX, and the selection control line LSEL are driven by the vertical scanning unit 201 serving as a pixel driving unit. Referring back to FIG. 2, the timing generation circuit unit 207 generates timing signals used for the signal processing in the pixel array unit 209, the vertical scanning unit 201, the signal processing unit 206, the column parallel AD converter unit 210, and the ramp generation circuit unit 208. The pixel array unit 209 photoelectrically converts a video or a screen image for every pixel row by accumulation and discharge of photons using a line shutter and supplies an analog signal to the column parallel AD converter unit 210. The column parallel AD converter unit 210 compares the analog signal output from the pixel array unit 209 with the ramp reference signal supplied from the ramp generation circuit unit 208 for every column to output a digital signal.

The column parallel AD converter unit 210 includes multiple AD converters arrayed therein. Each AD converter includes the comparator 204 that compares the ramp reference signal resulting from change of the reference signal into a stepwise form or a slope form with the analog signal that is supplied from the pixels 202 in each column through the vertical signal line 702 and that is amplified by the column amplifier 203. The AD converter in each column also includes the counter 205 that counts the comparison time and latches and holds the result of the counting. The comparator 204 arranged in each column inverts the output from the comparator 204 and stops the counting by the counter 205 when the voltage of the pixel signal supplied from the column amplifier 203 coincides with the voltage of the ramp reference signal to complete the AD conversion. Although the column amplifier 203 is used for every pixel column in the above configuration, the vertical signal line 702 may directly extend to the comparator 204. In the column parallel AD converter unit 210 according to the present embodiment, the bandwidth of the amplifier-type comparator is limited in order to reduce the noise in the pixels and/or the noise in the comparators. Specific configuration and function of each comparator 204 will be described below.

Figure 3:
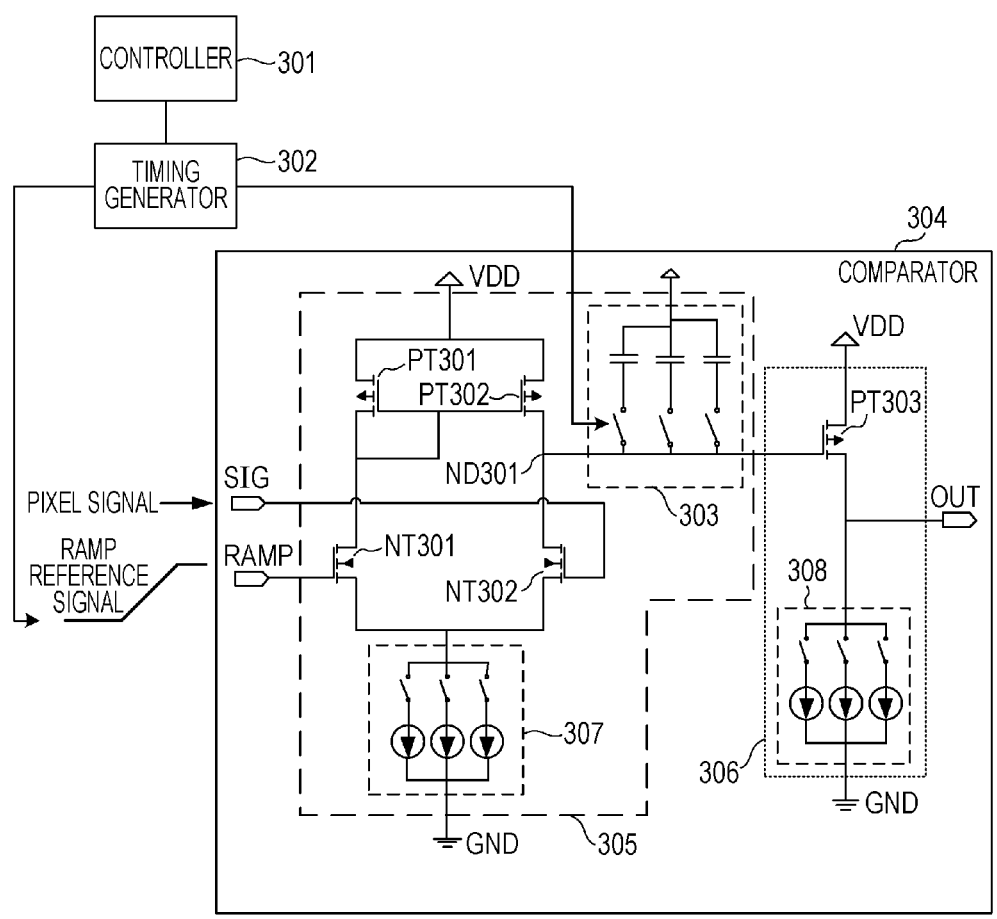
FIG. 3 is a circuit diagram showing an example of the configuration of a comparator in the column parallel AD converter using a variable capacitance.

FIG. 3 is a circuit diagram showing an example of the configuration of a comparator according to the present embodiment. A controller 301 in FIG. 3 corresponds to the control unit 109 in FIG. 1. A timing generator 302 in FIG. 3 corresponds to the timing generation circuit unit 105 in FIG. 1 and the timing generation circuit unit 207 in FIG. 2. A comparator 304 in FIG. 3 corresponds to the comparator 204 in FIG. 2. The comparator 304 has a multiple-stage structure including a first amplifier 305 and a second amplifier 306. A capacitance 303 including multiple switchable capacitance elements is connected between the output from the first stage and the input into the second stage. The capacitance 303 is connected to, for example, an output line of the first-stage amplifier in the power supply pair or the drain or the source of an input transistor of the second amplifier or is grounded. Accordingly, the load capacitance 303 can be switched to vary the bandwidth of the first stage of the comparator 304. Although the multiple capacitance elements are connected in parallel to each other in the variable capacitance 303 in the configuration in FIG. 3, the configuration of the comparator 304 is not limited to this. A first amplifier current source 307 composes a current mirror with the bias circuit unit 211. A bias voltage (bias value) can be varied or the mirror ratio can be switched with switches to vary the bandwidth of the first stage of the comparator 304. The configuration and the function of the comparator 304 having the feature configuration of the present embodiment will now be described in detail.

The comparator 304 includes the first amplifier 305, the second amplifier 306, and the switchable capacitance 303 allowing the bandwidth of the comparator 304 to be varied. The first amplifier 305, the capacitance 303, and the second amplifier 306 are connected in cascade to each other. The first amplifier 305 includes positive channel Metal Oxide Semiconductor (PMOS) transistors PT301 and PT302, negative channel Metal Oxide Semiconductor (NMOS) transistors NT301 to NT302, the variable capacitance 303, and the first amplifier current source 307. The source of the PMOS transistor PT301 and the source of the PMOS transistor PT302 are connected to a node of a constant potential power source VDD. The gate of the PMOS transistor PT301 and the gate of the PMOS transistor PT302 are connected to the drain of the PMOS transistor PT301. The drain of the PMOS transistor PT301 and the drain of the PMOS transistor PT302 are connected to the drain of the NMOS transistor NT301 and the drain of the NMOS transistor NT302, respectively. An interchange point (the output terminal of the first amplifier 305) ND301 between the drain of the PMOS transistor PT302 and the drain of the NMOS transistor NT302 is connected to the variable capacitance 303 and the gate of a PMOS transistor PT303. A ramp reference signal RAMP supplied from the ramp generation circuit unit 208 is input into the gate of the NMOS transistor (first transistor) NT301. A signal (pixel signal) SIG that is supplied from the column amplifier 203 and that is based on the pixels is input into the gate of the NMOS transistor (second transistor) NT302. The source of the NMOS transistor NT301 connected to the source of the NMOS transistor NT302 is connected to the first amplifier current source 307. The first amplifier current source 307 is connected to the bias circuit unit 211 outside the comparator 304 to compose the current mirror. The first amplifier current source 307 can vary the bias voltage (bias value) of the current mirror or can vary the mirror ratio to vary the amount of current. Although the variable capacitance 303 is connected so as to be sandwiched between the signal line and the power supply, the variable capacitance 303 may be connected to the drain of the second-stage PMOS transistor PT303 in order to utilize the mirror effect. The switches of the variable capacitance 303 are connected to the timing generator 302 outside the comparator 304. In the first amplifier 305, the PMOS transistors PT301 and PT302 compose a self-bias current mirror circuit and the NMOS transistors NT301 and NT302 compose a differential comparator using the first amplifier current source 307 as the current source. The first amplifier 305 compares the pixel signal SIG with the ramp reference signal RAMP and supplies the result of the comparison to the output terminal ND301. The capacitance 303 is connected to the output terminal ND301 of the first amplifier 305.

The second amplifier 306 includes the PMOS transistor PT303 and a second amplifier current source 308. The source of the PMOS transistor PT303 is connected to a node of the constant potential power source VDD and the gate thereof is connected to the output terminal ND301 of the first amplifier 305. The drain of the PMOS transistor PT303 is connected to the second amplifier current source 308 and an output signal OUT is output from the connection point between the drain of the PMOS transistor PT303 and the second amplifier current source 308. The second amplifier current source 308 is connected to the bias circuit unit 211 outside the comparator 304. In the second amplifier 306 having the above configuration, the PMOS transistor PT303 composes an input and amplifier circuit. The second amplifier 306 inverts and amplifies the signal from the output terminal ND301 of the first amplifier 305 to output the output signal OUT. When the variable capacitance 303 is connected between the output terminal ND301 of the first amplifier 305 and the drain of the PMOS transistor PT303, the variable capacitance 303 is equivalent to a case in which a capacitance resulting from multiplication of the variable capacitance 303 by an amount corresponding to the gain is connected between the output terminal ND301 and the node of the constant potential power source VDD because of the effect of the mirror effect. Although the amplifier-type comparator in which the differential pair is composed of the NMOS transistors is described here, another amplifier-type comparator in which the differential pair is composed of, for example, PMOS transistors may be adopted.

Figure 8:
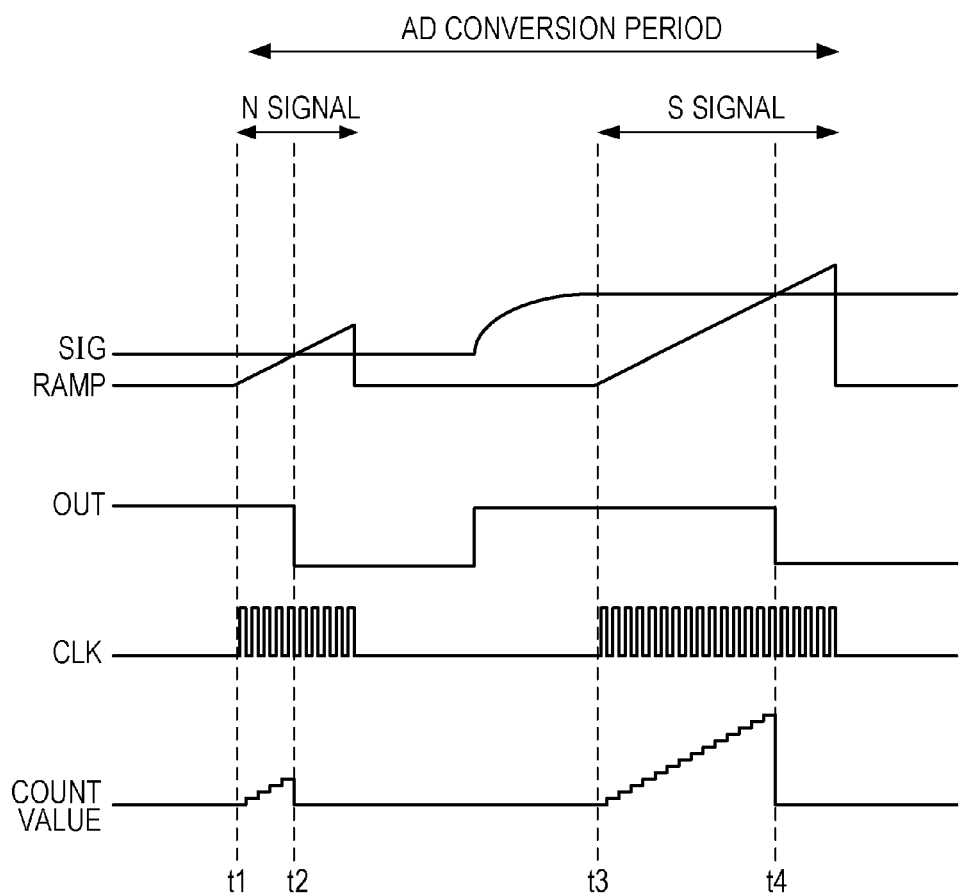
FIG. 8 is a timing chart of an AD conversion operation.

An example of the operation of the comparator 304 according to the present embodiment will now be described with reference to a timing chart in FIG. 8. As shown in FIG. 8, the AD conversion is performed twice, including the AD conversion in a pixel reset level and the AD conversion in an optical signal level, in order to perform the CDS for removing the pixel noise. The signal SIG resulting from the amplification of the pixel signal in the column amplifier 203 is input into the gate of the NMOS transistor NT302 in the comparator 304. Although the column amplifier 203 is used here, the vertical signal line 702 may be directly connected to the comparator 304 without using the column amplifier 203. The ramp reference signal RAMP is input into the gate of the NMOS transistor NT301 in the comparator 304. The comparator 304 compares the pixel signal SIG based on the pixel 202 with the ramp reference signal RAMP varied with time. The counter 205 starts the counting from times t1 and t3 when the ramp reference signal RAMP starts to increase and continues counting until times t2 and t4 when the relative relationship in magnitude between the pixel signal SIG and the ramp reference signal RAMP is reversed, such that RAMP exceeds SIG, and the output signal OUT from the comparator 304 is inverted. Before the time t1 when the AD conversion is started, the voltage value of the ramp reference signal RAMP is made constant. In the pixel reset level (N signal), the voltage value of the ramp reference signal RAMP is varied in a ramped manner simultaneously with the time t1 when the AD conversion is started. The pixel signal SIG at this time is in a state in which the pixel level is reset by the reset transistor 703 in FIG. 7. At a point where the voltage level of the ramp reference signal RAMP and the voltage level of the pixel signal SIG are reversed with respect to one another, the output signal OUT from the comparator 304 is inverted and the counting operation by the counter 205 is stopped. The clock count of the clock signal CLK counted by the counter 205 during the period from the time t1 when the AD conversion is started to the time t2 when the output signal OUT is inverted is used as the count value indicating the result of the AD conversion in the pixel reset level (N signal). Also in the AD conversion operation in the second round in which the AD conversion is performed in the optical signal level (S signal) of the pixels, the comparator 304 receives the ramp reference signal RAMP and the pixel signal SIG. The pixel signal SIG at this time is in a state in which the pixel level is not reset by the reset transistor 703 in FIG. 7. At the time t3 when the AD conversion is started, the ramp reference signal RAMP is varied in a ramped manner. The comparator 304 inverts the output signal OUT at the time t4 when the relationship in magnitude between the pixel signal SIG and the ramp reference signal RAMP is reversed. The counter 205 counts the clock count of the clock signal CLK during the period from the time t3 when the inclination of the ramp reference signal RAMP is started to the time t4 when the output signal OUT is inverted as the count value. The count value counted during the period from the time t3 to the time t4 indicates the result of the AD conversion. The signal processing unit 206 calculates the difference between the count value (S signal) by the counter 205 from the time t3 to the time t4 and the count value (N signal) by the counter 205 from the time t1 to the time t2 to acquire the pixel signal in which the pixel reset level is removed. The operation of the comparator 304 will now be described in detail.

Figure 4:
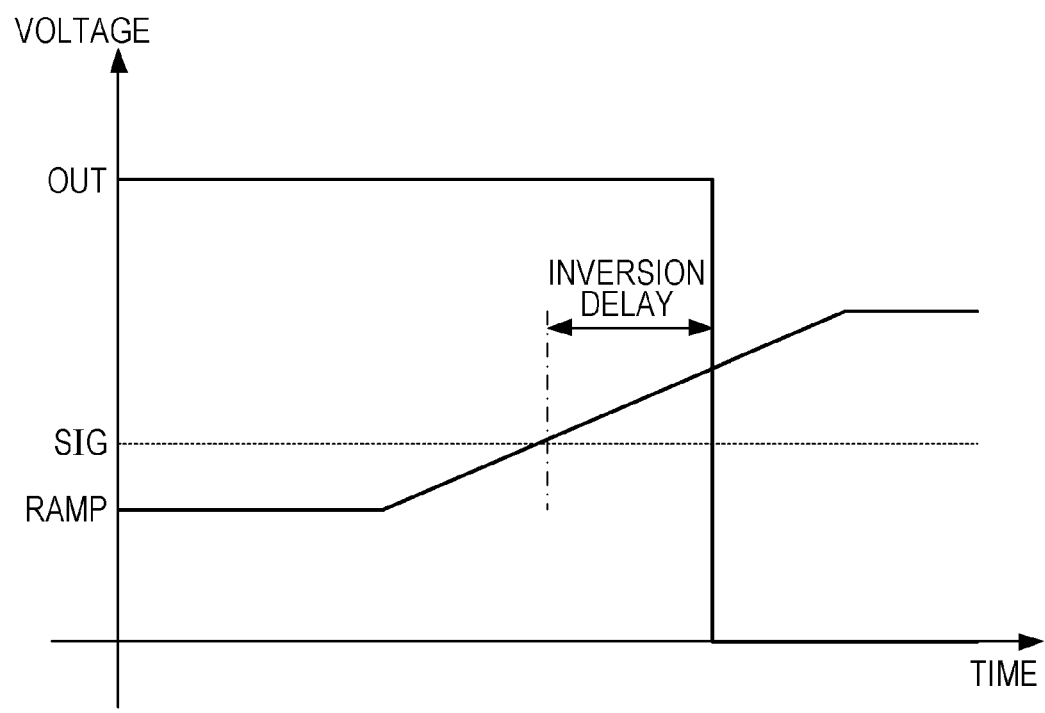
FIG. 4 shows an example of inversion delay in the comparator.

FIG. 4 shows an example of the inversion delay in the comparator 304. The ramp reference signal RAMP and the pixel signal SIG output from the column amplifier 203 are input into the NMOS transistors NT301 and NT302, which compose the differential pair in the first amplifier 305 in the comparator 304. When the ramp reference signal RAMP is varied in a ramped manner at the start of the AD conversion to be equal to the pixel signal SIG, the voltage of the output terminal ND301 of the first amplifier 305 is ideally inverted. Since the bandwidth limitation causes the random noise to be reduced and the S/N ratio to be improved in the amplifier-type comparator, the capacitance for the bandwidth limitation is used. However, using the high-load capacitance 303 in the comparator 304 causes a problem in that the bandwidth is reduced and the slew rate is degraded due to the charge and discharge into and from the capacitance 303 to increase the inversion delay shown in FIG. 4.

Figure 5:
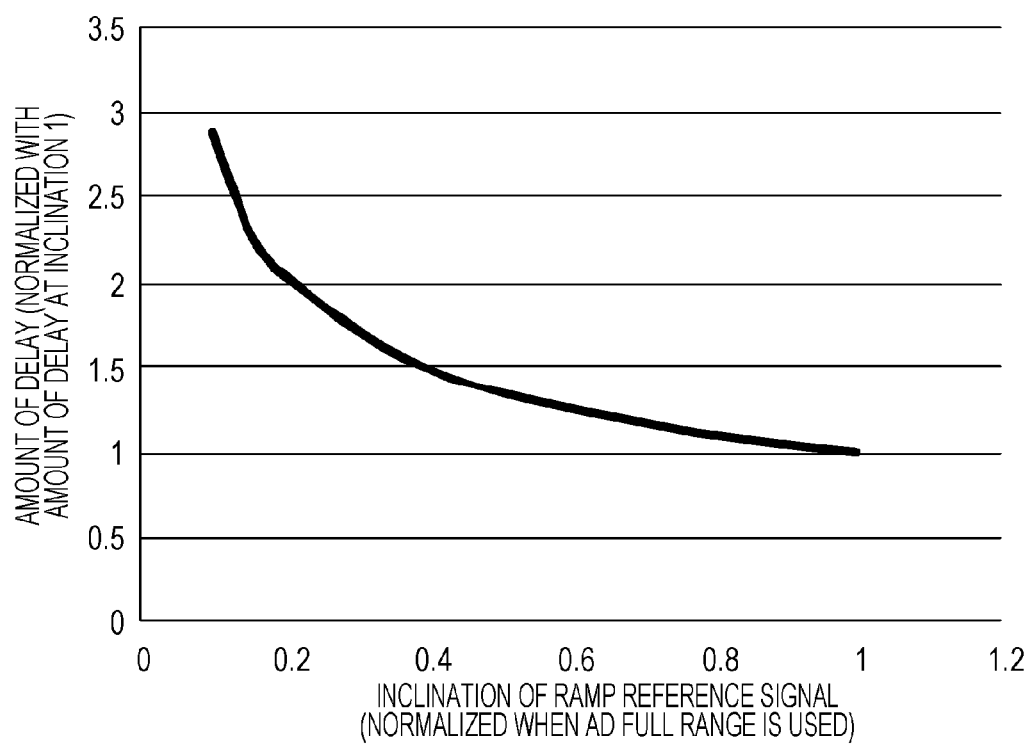
FIG. 5 shows an example of the relationship between the inversion delay in the comparator and the inclination of a ramp reference signal.

FIG. 5 shows an example of the relationship between the inclination of the ramp reference signal (voltage) and the inversion delay in the comparator 304. Referring to FIG. 5, the horizontal axis represents the inclination of the ramp reference signal RAMP and the vertical axis represents the inversion delay in the comparator 304. The values on the horizontal axis are normalized with a standard inclination being set to "1". The values on the vertical axis are normalized with the amount of the inversion delay at the inclination "1." As shown in FIG. 5, the inversion time has correlation with the inclination of the ramp reference signal RAMP. Specifically, there is a problem in that the inversion delay is increased with the decreasing inclination of the ramp reference signal RAMP. If the inversion delay in the comparator 304 is increased, it is necessary to extend the AD conversion time and, as a result, to decrease the frame rate.

In order to resolve the above problems, as shown in FIG. 3, the bandwidth of the amplifier-type comparator is controlled in conjunction with the inclination of the ramp reference signal RAMP in the present embodiment. Specifically, the controller 301 controlling the mode of the column parallel AD converter unit 210 supplies the control signal to the ramp generation circuit unit 208 and the variable capacitance 303 via the timing generator 302. At this time, a mode causing an appropriate inclination of the ramp reference signal RAMP is selected on the basis of, for example, the illumination of an image. The capacitance value corresponding to the inclination of the ramp reference signal RAMP prepared in advance in the controller 301 is selected as the value set for the variable capacitance 303 and the switches in the variable capacitance 303 are switched in accordance with the capacitance value. The correspondence between the ramp reference signal RAMP and the variable capacitance 303 may be prepared in advance, for example, in a table or the ramp reference signal RAMP may be sequentially associated with the variable capacitance 303. For example, the variable capacitance 303 and the inclination of the ramp reference signal RAMP has the following relationship. When the inclination of the ramp reference signal RAMP is small, that is the inversion delay is increased, the controller 301 decreases the load capacitance 303. When the inclination of the ramp reference signal RAMP is large, that is, the inversion delay is decreased, the controller 301 increases the load capacitance 303 to, for example, reduce the noise of the entire AD converter.

Other methods of controlling the bandwidth of the amplifier-type comparator includes a method of varying the amount of current supplied from the first amplifier current source 307 serving as a first variable current source. Specifically, the controller 301 controlling the mode of the column parallel AD converter unit 210 supplies the control signal to the ramp generation circuit unit 208 and the bias circuit unit 211 via the timing generator 302. The bias circuit unit 211 and the first amplifier current source 307 compose the current mirror circuit and the bias value of the bias circuit unit 211 can be varied to vary the amount of current flowing through the first amplifier 305 and the bandwidth of the first amplifier 305. A mode causing an appropriate inclination of the ramp reference signal RAMP is selected on the basis of, for example, the illumination of an image. The bias value corresponding to the inclination of the ramp reference signal RAMP prepared in advance in the controller 301 is selected as the value set for the bias circuit unit 211 and the current value of the first amplifier current source 307 is switched in accordance with the bias value. The correspondence between the ramp reference signal RAMP and the value set for the bias circuit unit 211 may be prepared in advance, for example, in a table or the ramp reference signal RAMP may be sequentially associated with the value set for the bias circuit unit 211. The configuration of the first amplifier current source 307 is not limited to the one described above and another configuration may be adopted as long as the amount of current can be varied in the configuration.

Although the first amplifier current source 307 is exemplified here, the amount of current supplied from the second amplifier current source 308 serving as a second variable current source may be varied. Alternatively, both the amount of current supplied from the first amplifier current source 307 and the amount of current supplied from the second amplifier current source 308 may be switched. Alternatively, the bias voltage of the current mirror circuit may be varied in order to vary the amounts of current supplied from the first and second amplifier current sources 307 and 308.

The controller 301 sets the bandwidth of the comparator 304 to a first bandwidth when the ramp reference signal RAMP is varied with time at a first rate of change. The controller 301 sets the bandwidth of the comparator 304 to a second bandwidth broader than the first bandwidth when the ramp reference signal RAMP is varied with time at a second rate of change smaller than the first rate of change. For example, the controller 301 controls the capacitance 303 in the comparator 304 in accordance with the rate of change (the inclination) of the ramp reference signal RAMP with respect to time. Specifically, the controller 301 sets the capacitance 303 in the comparator 304 to a first capacitance value when the rate of change of the ramp reference signal RAMP with respect to time is equal to the first rate of change. The controller 301 sets the capacitance 303 in the comparator 304 to a second capacitance value smaller than the first capacitance value when the rate of change of the ramp reference signal RAMP with respect to time is equal to the second rate of change smaller than the first rate of change. The controller 301 sets the capacitance 303 to the first capacitance value when the rate of change of the ramp reference signal RAMP with respect to time is set to the first rate of change and sets the capacitance 303 to the second capacitance value when the rate of change of the ramp reference signal RAMP with respect to time is set to the second rate of change. The controller 301 controls the rate of change of the ramp reference signal RAMP with respect to time. The ramp generation circuit unit (the reference signal generating circuit) 208 generates the ramp reference signal RAMP at the rate of change with respect to time controlled by the controller 301.

Figure 6:
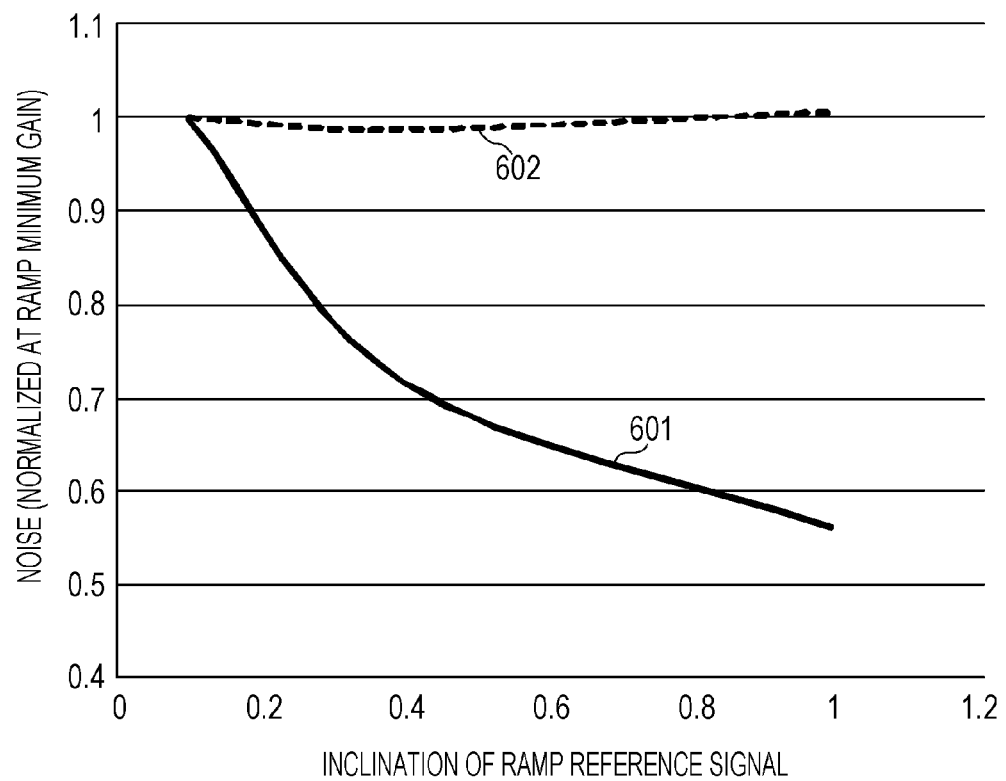
FIG. 6 is a graph for comparing noise characteristics.

FIG. 6 shows an example of the relationship between a noise characteristic 602 when the capacitance is fixed and a noise characteristic 601 when the variable capacitance 303 is controlled in accordance with the inclination of the ramp reference signal RAMP, under the constrain that the inversion delay is made lower than or equal to a certain value. Referring to FIG. 6, the horizontal axis represents the inclination of the ramp reference signal RAMP and the values on the horizontal axis are normalized with the standard inclination being set to "1." The vertical axis represents the amount of noise appearing in the output signal OUT from the comparator 304. The amounts of noise are normalized with the noise value of the noise characteristic 602 when the inclination of the ramp reference signal RAMP is equal to "0.1" being set to "1."FIG. 6 shows that the noise performance is capable of being largely improved when the inclination of the ramp reference signal RAMP is large in the noise characteristic 601 in the present embodiment. The variable capacitance 303 may be switched, for example, in synchronization with the timing when the ramp reference signal RAMP is varied or in synchronization with a horizontal synchronization signal or a vertical synchronization signal. However, the timing when the variable capacitance 303 is switched is not limited to the above ones.

The embodiments described above are only examples and it will be clear that the technical range of the present invention is not limitedly interpreted. In other words, the present invention may be embodied in various modes without departing from the technical scope or the main features. For example, although the capacitance values of the multiple capacitance elements in the capacitance 303 are switched with the switches in the above embodiments, the capacitance value of the capacitance 303 may be varied with variable capacitance elements. The ramp reference signal is not limited to the one whose level is linearly varied with time and the ramp reference signal whose level is varied with time in a stepwise manner may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-172179 filed Aug. 5, 2011, which is hereby incorporated by reference in its entirety.

What is claimed is:

1. An image pickup apparatus comprising:
   a pixel configured to generate a signal by photoelectric conversion;
   a comparator configured to compare the signal based on the pixel with a reference signal varied with time;
   a counter configured to perform counting until the comparator outputs a signal indicating that a relationship in magnitude between the signal based on the pixel and the reference signal is reversed; and
   a control unit,
   wherein the comparator includes a first amplifier that receives the reference signal at a first input portion and the signal based on the pixel at a second input portion to compare the signal based on the pixel with the reference signal, and
   wherein the control unit sets a bandwidth of the comparator to a first bandwidth when the reference signal varies with time at a first rate of change and sets the bandwidth of the comparator to a second bandwidth broader than the first bandwidth when the reference signal varies with time at a second rate of change smaller than the first rate of change.

2. The image pickup apparatus according to claim 1,
   wherein the first amplifier includes an output terminal and a variable capacitance connected to the output terminal, and
   wherein the control unit sets the variable capacitance to a first value when the bandwidth of the comparator is set to the first bandwidth, and to a second value lower than the first value when the bandwidth of the comparator is set to the second bandwidth.

3. The image pickup apparatus according to claim 2,
   wherein the variable capacitance includes a plurality of capacitance elements connected in parallel to each other.

4. The image pickup apparatus according to claim 1, further comprising:
   a first variable current source arranged to supply current for driving the first amplifier.

5. The image pickup apparatus according to claim 4,
   wherein the first variable current source includes a plurality of current sources connected in parallel to each other.

6. The image pickup apparatus according to claim 4,
wherein the first variable current source includes a current mirror circuit and varies a bias value to be supplied to the current mirror circuit to vary an amount of current supplied from the first variable current source.

7. The image pickup apparatus according to claim 4,
wherein the control unit causes the current supplied from the first variable current source when the bandwidth of the comparator is set to the first bandwidth to be smaller than the current supplied when the bandwidth of the comparator is set to the second bandwidth.

8. The image pickup apparatus according to claim 1,
wherein the comparator includes a second amplifier that amplifies a signal output from the first amplifier.

9. The image pickup apparatus according to claim 8, further comprising:
a second variable current source arranged to supply current to the second amplifier.

10. The image pickup apparatus according to claim 9,
wherein the second variable current source includes a plurality of current sources connected in parallel to each other.

11. The image pickup apparatus according to claim 9,
wherein the second variable current source includes a current mirror circuit and varies a bias value to be supplied to the current mirror circuit to vary an amount of current supplied from the second variable current source.

12. The image pickup apparatus according to claim 9,
wherein the control unit causes the current supplied from the second variable current source when the bandwidth of the comparator is set to the first bandwidth to be smaller than the current supplied when the bandwidth of the comparator is set to the second bandwidth.

13. The image pickup apparatus according to claim 1,
wherein the control unit controls a rate of change of the reference signal with respect to time, and the image pickup apparatus further comprises:
a reference signal generating circuit configured to generate the reference signal at the rate of change with respect to time controlled by the control unit.

* * * * *